US010028420B2

(12) United States Patent
Cho et al.

(10) Patent No.: US 10,028,420 B2
(45) Date of Patent: Jul. 17, 2018

(54) SHEET FOR SHIELDING AGAINST ELECTROMAGNETIC WAVES AND WIRELESS POWER CHARGING DEVICE

(71) Applicant: SAMSUNG ELECTRO-MECHANICS CO., LTD., Suwon-Si, Gyeonggi-Do (KR)

(72) Inventors: Jung Young Cho, Suwon-si (KR); Doo Ho Park, Suwon-si (KR); Sung Nam Cho, Suwon-si (KR); Jung Wook Seo, Suwon-si (KR); Jong Ho Chung, Suwon-si (KR); Seung Hee Oh, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/057,766

(22) Filed: Mar. 1, 2016

(65) Prior Publication Data
US 2016/0345471 A1 Nov. 24, 2016

(30) Foreign Application Priority Data

May 22, 2015 (KR) .................. 10-2015-0072174
Jul. 27, 2015 (KR) .................. 10-2015-0105736

(51) Int. Cl.
| H05K 9/00 | (2006.01) |
| H02J 7/02 | (2016.01) |
| H02J 50/12 | (2016.01) |
| H01F 27/36 | (2006.01) |
| H02J 50/70 | (2016.01) |

(52) U.S. Cl.
CPC .......... H05K 9/0075 (2013.01); H01F 27/365 (2013.01); H02J 7/025 (2013.01); H02J 50/12 (2016.02); H02J 50/70 (2016.02)

(58) Field of Classification Search
None
See application file for complete search history.

(56) References Cited

U.S. PATENT DOCUMENTS 5,639,989 A * 6/1997 Higgins, III .......... H01L 23/552
174/386
7,981,528 B2 * 7/2011 Nakatani .......... G06K 19/07749
428/692.1
(Continued)

FOREIGN PATENT DOCUMENTS

JP 2001053485 A * 2/2001
KR 10-2014-0065364 A 5/2014
(Continued)

OTHER PUBLICATIONS

Derwent Abstract of JP 2001-053485 A (pub. 2001).*
(Continued)

*Primary Examiner* — Kevin M Bernatz
(74) *Attorney, Agent, or Firm* — McDermott Will & Emery LLP

(57) ABSTRACT

A sheet for shielding against electromagnetic waves includes a first magnetic material having a plurality of through holes formed in a thickness direction, and a second magnetic material filling the plurality of through holes and blocking a frequency band different from that of electromagnetic waves blocked by the first magnetic material.

18 Claims, 4 Drawing Sheets

(56) References Cited

U.S. PATENT DOCUMENTS

| | | | |
|---|---|---|---|
| 8,809,687 B2* | 8/2014 | Watanabe | H05K 1/028 174/254 |
| 8,889,570 B2* | 11/2014 | Matsumura | B32B 27/08 174/388 |
| 9,252,611 B2* | 2/2016 | Lee | H01F 38/14 |
| 2004/0108486 A1* | 6/2004 | Yoshida | H01F 1/22 252/62.54 |
| 2005/0045358 A1* | 3/2005 | Arnold | H05K 9/0024 174/51 |
| 2005/0089708 A1* | 4/2005 | Maruko | C22C 45/04 428/611 |
| 2007/0047278 A1* | 3/2007 | Yamamoto | H01L 23/49582 363/144 |
| 2007/0196671 A1* | 8/2007 | Kobayashi | B82Y 25/00 428/447 |
| 2009/0261414 A1* | 10/2009 | Oikawa | H01L 21/568 257/347 |
| 2012/0236528 A1* | 9/2012 | Le | H05K 9/0088 361/818 |
| 2014/0176380 A1* | 6/2014 | Choi | H01Q 1/38 343/787 |
| 2014/0191716 A1 | 7/2014 | Lee et al. | |
| 2014/0320369 A1* | 10/2014 | Azenui | H01Q 1/526 343/841 |
| 2015/0001951 A1* | 1/2015 | Park | H01F 38/14 307/104 |
| 2015/0102892 A1 | 4/2015 | Yeo et al. | |
| 2015/0109179 A1* | 4/2015 | Ryu | H01Q 9/0407 343/788 |
| 2015/0163903 A1* | 6/2015 | Wada | H05K 3/321 361/760 |
| 2015/0235121 A1* | 8/2015 | Pavate | G06K 19/07783 235/492 |
| 2016/0057900 A1* | 2/2016 | Polak | H01F 27/365 320/108 |
| 2016/0064814 A1* | 3/2016 | Jang | H01Q 1/526 343/842 |
| 2016/0322562 A1* | 11/2016 | Jang | H01L 43/08 |
| 2017/0025601 A1* | 1/2017 | Bhushan | H01L 43/08 |
| 2017/0047507 A1* | 2/2017 | Seo | H01L 23/552 |

FOREIGN PATENT DOCUMENTS

| | | |
|---|---|---|
| KR | 10-2014-0089192 A | 7/2014 |
| KR | 10-2014-0108946 A | 9/2014 |
| KR | 10-2015-0043087 A | 4/2015 |
| KR | 10-2015-0054739 A | 5/2015 |

OTHER PUBLICATIONS

Derwent Abstract of KR 2014-065364 A (pub. 2014).*
Derwent Abstract of DE 10-2013-103268 A1 (pub. 2014).*
Derwent Abstract of KR 2015-054739 A (pub. 2015).*
Derwent Abstract of WO 2013-095036 A1 (published 2013).*
Notice of Office Action dated Jul. 15, 2016 in Korean Patent Application No. 10-2015-0105736 with English language translation.

* cited by examiner

SHEET FOR SHIELDING AGAINST ELECTROMAGNETIC WAVES AND WIRELESS POWER CHARGING DEVICE

CROSS-REFERENCE TO RELATED APPLICATION

This application claims the benefit of priority to Korean Patent Application Nos. 10-2015-0072174 and 10-2015-0105736, filed on May 22, 2015 and Jul. 27, 2015, respectively, with the Korean Intellectual Property Office, the entirety of which is incorporated herein by reference.

TECHNICAL FIELD

The present disclosure relates to a sheet for shielding against electromagnetic waves and a wireless power charging device.

BACKGROUND

As various electronic devices are reduced in weight due to a reduction in size, a non-contact type, that is, a wireless power charging scheme for charging a battery using magnetic coupling (or inductive coupling) without electrical contact has come into prominence.

A wireless power charging scheme is a scheme in which charging is performed through the use of electromagnetic induction. A primary coil (transmitter coil) is provided in a charger (wireless power transmitting device), and a secondary coil (receiver coil) is provided in a charge target (wireless power receiving device). A current generated according to inductive coupling between the primary coil and the secondary coil transmits energy used to charge a battery.

A sheet for shielding against electromagnetic waves (or a shielding sheet) may be disposed between the receiver coil and the battery. The shielding sheet serves to block a magnetic field generated by the receiver coil from reaching the battery and to allow electromagnetic waves generated by the wireless power transmitting device to be effectively transmitted to the wireless power receiving device.

In the sheet for shielding against electromagnetic waves, an eddy current may be generated due to electromotive force resulting from a change in magnetic flux within a magnetic material. The eddy current may cause power loss and an increase in temperature of the magnetic material. Also, a magnetic field generated by the eddy current may inversely act on a direction of a magnetic field generated by the transmitter, significantly degrading power charging efficiency.

SUMMARY

An aspect of the present disclosure provides a sheet for shielding against electromagnetic waves, and a wireless power charging device capable of performing a shielding function in different frequency bands so as to be used in a plurality of wireless charging schemes.

An aspect of the present disclosure also provides a sheet for shielding against electromagnetic waves, and a wireless power charging device capable of enhancing heating characteristics and power charging efficiency by reducing an influence of an eddy current.

According to an aspect of the present disclosure, a novel structure of a sheet for shielding against electromagnetic waves is provided, which realizes different wireless power charging schemes in a single sheet, advantageously reduces thickness, and enhances heating characteristics and power charging efficiency. In detail, the sheet for shielding against electromagnetic waves has a structure including a first magnetic material having through holes and a second magnetic material provided to fill the through holes.

Here, the second magnetic material blocks a frequency band different from that of electromagnetic waves blocked by the first magnetic material, thereby realizing the aforementioned multi-wireless power charging device. For example, the first magnetic material may block a frequency band ranging from 100 to 300 KHz, and the second magnetic material may block a frequency band ranging from 6 to 7 MHz. In detail, the first magnetic material may perform a shielding function for an inductive coupling scheme, and the second magnetic material may perform a shielding function for a resonant magnetic coupling scheme using a frequency of about 6.78 MHz.

According to another aspect of the present disclosure, a sheet for shielding against electromagnetic waves comprises: a first magnetic material blocking a first frequency band of electromagnetic waves; and a second magnetic material blocking a second frequency band of electromagnetic waves. The first frequency band is different from the second frequency band.

The second magnetic material may have a lower electrical conductivity than the first magnetic material.

The first and second magnetic materials may be arranged into a plurality of magnetic layers.

The sheet may further comprise an adhesive layer interposed between adjacent magnetic layers among the plurality of magnetic layers.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
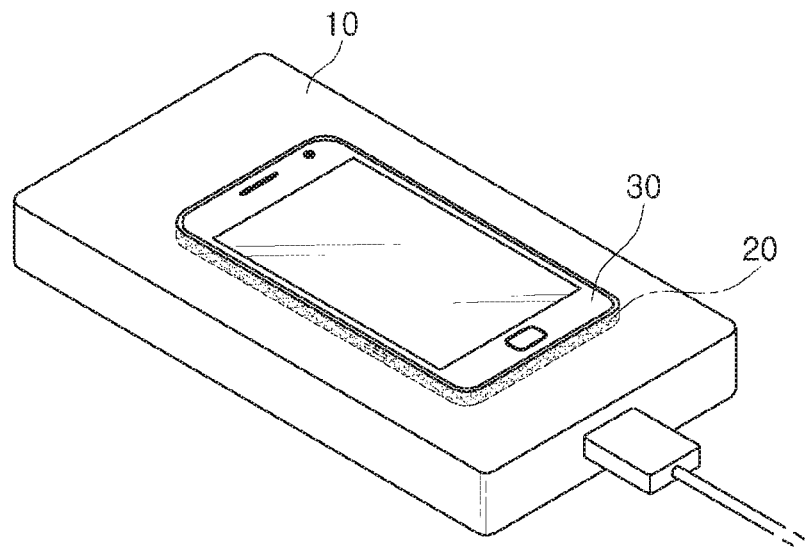
FIG. 1 is an external perspective view of a general wireless charging system.

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "upper," or "above" other elements would then be oriented "lower," or "below" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted by one or a combination thereof.

The contents of the present inventive concept described below may have a variety of configurations and propose only a required configuration herein, but are not limited thereto.

Figure 2:
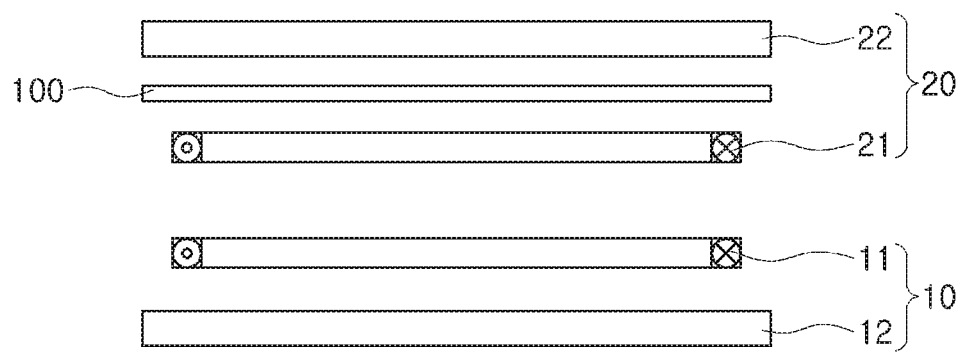
FIG. 2 is an exploded cross-sectional view illustrating major internal components of FIG. 1.

FIG. 1 is an external perspective view of a general wireless charging system, and FIG. 2 is an exploded cross-sectional view illustrating major internal components of FIG. 1.

Referring to FIGS. 1 and 2, a general wireless charging system may include a wireless power transmitting device 10 and a wireless power receiving device 20. The wireless power receiving device 20 may be included in an electronic device 30 such as a mobile phone, a laptop computer, or a tablet PC.

Regarding the interior of the wireless power transmitting device 10, a transmitter coil 11 is formed on a substrate 12, and when an alternating current (AC) voltage is applied to the wireless power transmitting device 10, a magnetic field is formed around the transmitter coil 11. Accordingly, electromotive force induced from the transmitter coil 11 is generated in a receiver coil 21 installed in the wireless power receiving device 20 to charge a battery 22.

The battery 22 may be a nickel metal hydrogen battery or a lithium ion battery which may be charged or discharged, but is not limited thereto. Also, the battery 22 may be configured to be separated from the wireless power receiving device 20 and detachably attached to the wireless power receiving device 20, or may be integrally configured with the wireless power receiving device 20.

The transmitter coil 11 and the receiver coil 21 may be electromagnetically coupled, and may be formed by winding a metal wire such as copper therearound. In this case, the metal wire may be wound in a circular, oval, quadrangular, or a diamond shape, and an overall size or the number of windings may be appropriately controlled to be set according to required characteristics.

A sheet 100 for shielding against electromagnetic waves (hereinafter referred to as an "electromagnetic wave blocking sheet 100") may be disposed between the receiver coil 21 and the battery 22. The electromagnetic wave blocking sheet 100 positioned between the receiver coil 21 and the battery 22 may concentrate magnetic flux to be effectively received by the receiver coil 21. Also, the electromagnetic wave blocking sheet 100 serves to block at least a portion of magnetic flux from reaching the battery 22. Hereinafter, the electromagnetic wave blocking sheet 100 will be described in detail.

Figure 3:
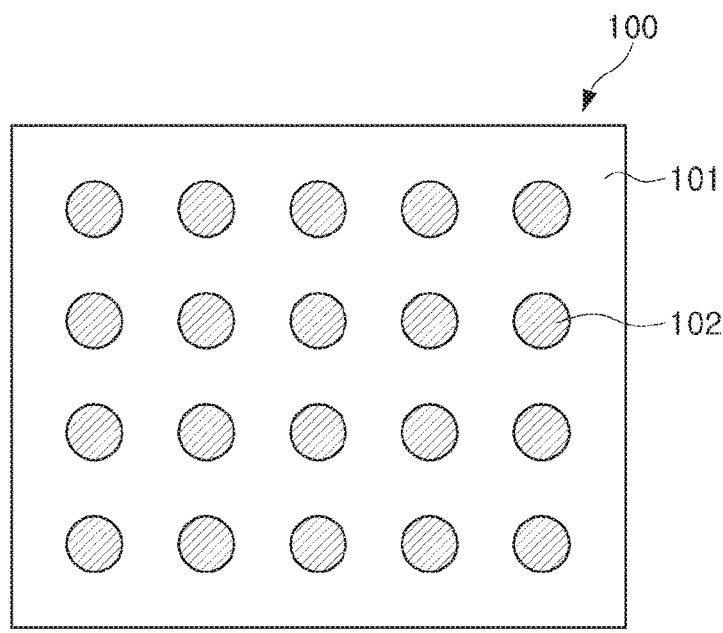
FIGS. 3 and 4 are a plan view and a cross-sectional view schematically illustrating a sheet for shielding against electromagnetic waves according to an exemplary embodiment in the present disclosure.
Figure 4:

FIGS. 3 and 4 are a plan view and a cross-sectional view schematically illustrating a sheet for blocking electromagnetic waves according to an exemplary embodiment. The electromagnetic wave blocking sheet 100 includes first and second magnetic materials 101 and 102. As illustrated in FIGS. 3 and 4, the first magnetic material 101 has a plurality of through holes formed in a thickness direction, and the plurality of through holes are filled with the second magnetic material 102. Here, the first and second magnetic materials 101 and 102 block different frequency bands of electromagnetic waves. Here, the difference in frequency bands refers to a difference in main frequency regions to be concentrated or blocked, but does not refer to a complete difference in frequencies of concentrated and blocked electromagnetic waves.

In detail, the first magnetic material 101 may block a frequency band ranging from 100 to 300 KHz, and the second magnetic material 102 may block a frequency band ranging from 6 to 7 MHz. Specifically, the first magnetic material 101 may perform a blocking function for an electromagnetic coupling scheme, and the second magnetic material 102 may perform a blocking function for resonant magnetic coupling. In this manner, the electromagnetic wave blocking sheet 100 proposed in the present exemplary embodiment performs the concentration and blocking function with respect to different frequency bands, allowing different wireless charging schemes to be realized in a single sheet, and thus, it is advantageous in reducing thickness of a wireless power charging device or an electronic device.

In order to perform the aforementioned function, as the first magnetic material 101, a thin plate metal ribbon formed of an amorphous alloy or a nanocrystalline alloy may be used. Here, as the amorphous alloy, an Fe-based or Co-based magnetic alloy may be used. The Fe-based magnetic alloy may be, for example, an Fe—Si—B alloy. As the content of a metal including Fe is increased, a saturation magnetic flux density may be increased, but an excess of the content of Fe makes it difficult to become amorphous. Thus, the content of Fe may range from 70 to 90 atomic %, and the best amorphous forming ability of the alloy may be obtained when the sum of silicon (Si) and boron (B) ranges from 10 to 30 atomic %. With respect to the basic composition, a corrosion-resistant element such as chromium (Cr) or cobalt (Co) may be added in an amount of 20 atomic % to prevent corrosion, or a small amount of other metal elements may be added as necessary in order to provide other characteristics.

In the case of using a nanocrystalline alloy, an Fe-based nanocrystalline magnetic alloy may be used. As the Fe-based nanocrystalline magnetic alloy, an Fe—Si—B—Cu—Nb alloy may be used.

The second magnetic material 102 may be formed of a soft magnetic material. For example, the second magnetic material 102 may be formed of a Mn—Zn-based, Mn—Ni-based, Ba, and Sr-based ferrite material, and in addition, these materials may be formed as nanocrystalline powder.

In order to form the through holes in the first magnetic material 101, a process known in the art may be used. For example, the through holes may be formed by mechanically machining a metal ribbon. Also, in the present exemplary embodiment, a sheet that may function in two frequency bands is proposed; however, without being limited thereto, three or more magnetic materials may be used according to desired frequency bands.

Having the aforementioned structure, the electromagnetic wave blocking sheet 100 may reduce the influence of an eddy current and perform a blocking function in a plurality of frequency bands. During a process such as wireless power charging, an eddy current may be generated due to electromotive force according to a change in magnetic flux within the electromagnetic wave blocking sheet 100. In the present exemplary embodiment, in order to reduce an influence of the eddy current, the second magnetic material 102 is formed of a material having specific resistance higher than that of the first magnetic material 101, that is, a material having lower electrical conductivity. This configuration may also be obtained when the aforementioned materials are employed (for example, in the case in which a metal ribbon is used as the first magnetic material and ferrite is used as the second magnetic material). In this case, since the second magnetic material 102 having relatively low electrical conductivity is arranged in the first magnetic material 101, an eddy current generated in the first magnetic material 101 may be reduced. Here, in order to further enhance the eddy current reduction function, the second magnetic material 102 may be formed of a material having electrical insulation properties.

In order to perform the aforementioned functions, the second magnetic material 102 may be arranged in a regular pattern in the first magnetic material 101 as illustrated in FIG. 3. In contrast to FIG. 3, the pattern may also be deformed to a zigzag form. Also, the second magnetic material 102 may be arranged in an irregular form in the first magnetic material 101, and also, in this case, the functions of concentrating and blocking an electromagnetic wave and reducing an eddy current may be exhibited.

Figure 5:
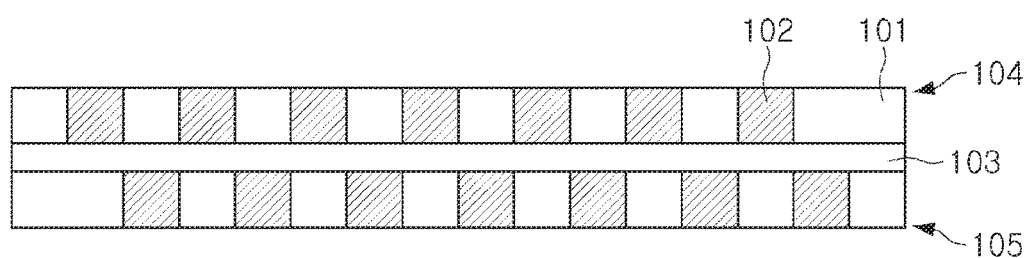
FIGS. 5 through 7 are cross-sectional views schematically illustrating a sheet for shielding against electromagnetic waves according to another exemplary embodiment in the present disclosure.
Figure 6:
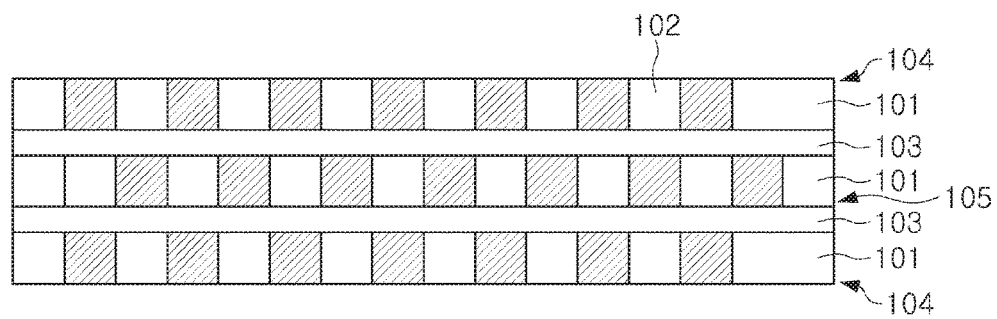
Figure 7:
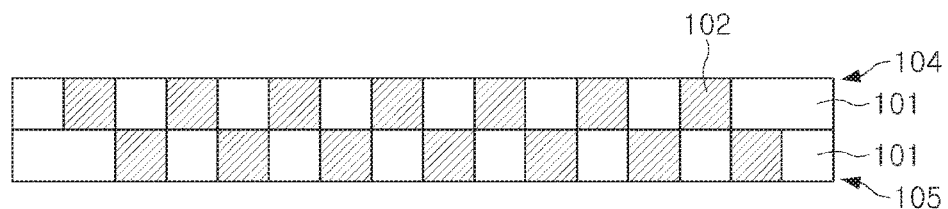

The electromagnetic wave blocking sheet 100 may have a stacked structure including a plurality of layers, rather than consisting of a single layer. In this case, the number of stacked layers may be appropriately adjusted according to an intended blocking function or a size of an electronic device. Referring to FIGS. 5 through 7, in electromagnetic wave blocking sheets illustrated in these exemplary embodiments, the first magnetic layer 104 may be provided in plural to have a stacked structure, and each of the first magnetic layers 104 may be bonded by an adhesive layer 103. As shown in FIG. 5, first magnetic layer 104 may be bonded to second magnetic layer 105 by an adhesive layer 103. Furthermore, as shown in FIG. 6, first magnetic layer 104 may be bonded to a first surface of second magnetic layer 105 by an adhesive layer 103, and second magnetic layer 105 may be bonded to another first magnetic layer 104 through another adhesive layer 103. Alternatively, as in the example of FIG. 7, the first magnetic layer 104 may be coupled to a second magnetic layer 105 without using an adhesive layer. First and second magnetic layers 104 and 105 may each comprise the first and second magnetic materials 101 and 102.

Without using an adhesive layer, the first magnetic layer 104 may be stacked on the second magnetic layer 105 as a paste or in an uncured state, and pressure or heat may be applied thereto to obtain the aforementioned stacked structure.

In a case of using a structure in which a plurality of first and second magnetic layers 104 and 105 are stacked, a position of the second magnetic material 102 may be adjusted in order to enhance the electromagnetic wave blocking function. In detail, as illustrated in FIGS. 5 through 7, the second magnetic material 102 and other second magnetic materials 102 disposed thereabove or therebelow in the plurality of first and second magnetic layers 104 and 105 may be staggered (that is, may be disposed in alternate positions), and through this disposition, electromagnetic wave blocking may be realized more effectively.

Figure 8:
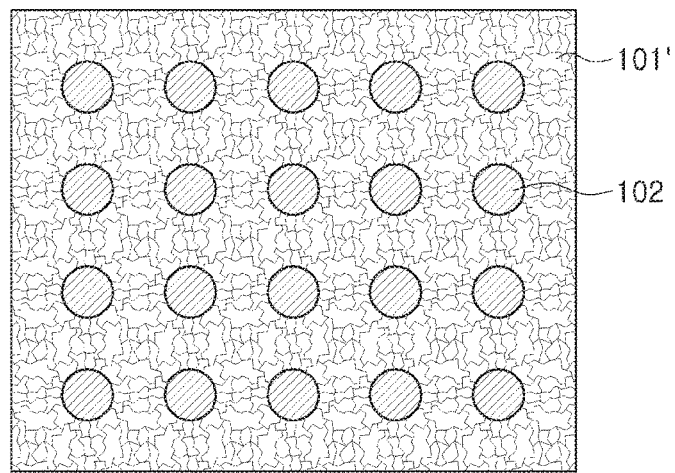
FIGS. 8 and 9 are plan views schematically illustrating a sheet for shielding against electromagnetic waves according to another exemplary embodiment in the present disclosure.
Figure 9:
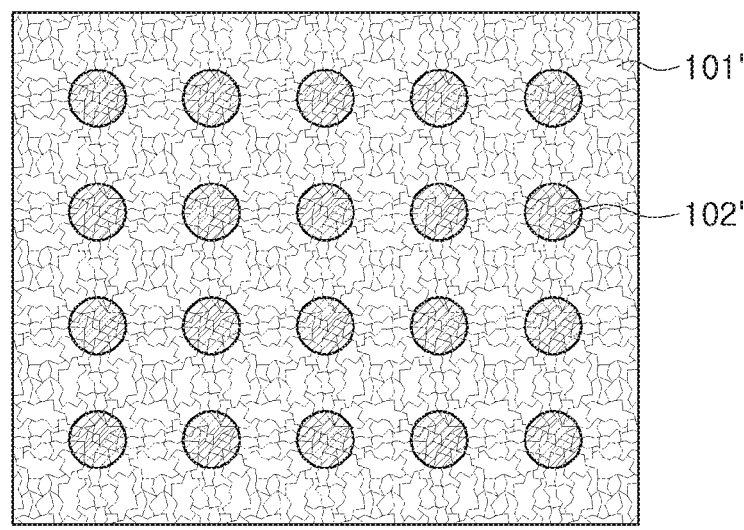

Electromagnetic wave blocking sheets according to other exemplary embodiments will be described with reference to FIGS. 8 and 9. In the exemplary embodiment illustrated in FIG. 8, a first magnetic material 101' is fractured into a plurality of fragments, and through this fracturing treatment, an eddy current of the first magnetic material 101' may be further reduced. Besides the first magnetic material 101', as in the exemplary embodiment illustrated in FIG. 9, a second magnetic material 102' may be fractured to be separated into a plurality of fragments as desired.

As set forth above, the sheet for shielding against electromagnetic waves and the wireless power charging device proposed in the exemplary embodiments perform the function of blocking multiple frequency bands. Thus, the electromagnetic wave blocking sheet and the wireless power charging device may be used in a plurality of wireless power charging schemes.

In addition, the use of the electromagnetic wave blocking sheet and the wireless power charging device may reduce the influence of an eddy current, enhancing heating characteristics and power charging efficiency.

While exemplary embodiments have been shown and described above, it will be apparent to those skilled in the art that modifications and variations could be made without departing from the scope of the present invention as defined by the appended claims.

What is claimed is:

1. A sheet for shielding against electromagnetic waves, the sheet comprising:
   a first magnetic material having a plurality of through holes formed in a thickness direction; and
   a second magnetic material filling the plurality of through holes and blocking a frequency band including higher frequencies of electromagnetic waves than a frequency band blocked by the first magnetic material having the plurality of through holes formed therein,
   wherein the plurality of through holes are evenly distributed as an array in the first magnetic material.

2. The sheet of claim 1, wherein the first magnetic material blocks a frequency band ranging from 100 to 300 KHz.

3. The sheet of claim 1, wherein the first magnetic material performs a blocking function for an inductive coupling scheme.

4. The sheet of claim 1, wherein the second magnetic material blocks a frequency band ranging from 6 to 7 MHz.

5. The sheet of claim 1, wherein the second magnetic material performs a blocking function for a resonant magnetic coupling scheme.

6. The sheet of claim 1, wherein the second magnetic material is formed of a material having specific resistance higher than that of the first magnetic material.

7. The sheet of claim 1, wherein the second magnetic material is formed of a soft magnetic material.

8. The sheet of claim 1, wherein the second magnetic material is formed of a material having electrical insulation properties.

9. The sheet of claim 1, wherein the first magnetic material includes a metal ribbon.

10. The sheet of claim 1, wherein the first and second magnetic materials are provided in a plurality of magnetic layers to have a stacked structure.

11. The sheet of claim 10, wherein an adhesive layer is interposed between adjacent magnetic layers among the plurality of magnetic layers.

12. The sheet of claim 10, wherein adjacent magnetic layers among the plurality of magnetic layers are directly coupled without using an adhesive layer.

13. The sheet of claim 10, wherein the first magnetic material comprises a plurality of fragments.

14. The sheet of claim 13, wherein the second magnetic material comprises a plurality of fragments.

15. The sheet of claim 10 wherein, in each magnetic layer of the stacked structure, the first magnetic material has a plurality of through holes formed in a thickness direction and the second magnetic material filling the plurality of through holes.

16. A sheet for shielding against electromagnetic waves, the sheet comprising:
   a first magnetic material having a plurality of through holes formed in a thickness direction; and
   a second magnetic material filling the plurality of through holes and blocking a frequency band different from that of electromagnetic waves blocked by the first magnetic material,
   wherein the first and second magnetic materials are provided in a plurality of magnetic layers to have a stacked structure, and
   wherein the second magnetic material in a magnetic layer among the plurality of magnetic layers is staggered relative to the second magnetic material disposed thereabove or therebelow in an adjacent magnetic layer among the plurality of magnetic layers.

17. A wireless power charging device comprising:
   a coil unit; and
   an electromagnetic wave blocking sheet disposed between the coil unit and an external battery having a first magnetic material having a plurality of through holes formed in a thickness direction, and a second magnetic material filling the plurality of through holes and blocking a frequency band different from that of an electromagnetic wave blocked by the first magnetic material,
   wherein the plurality of through holes are evenly distributed as an array in the first magnetic material, and
   wherein the second magnetic material blocks the frequency band including higher frequencies of electromagnetic waves than a frequency band blocked by the first magnetic material.

18. The wireless power charging device of claim 17, wherein the first and second magnetic materials are provided in a plurality of magnetic layers to have a stacked structure and, in each magnetic layer of the stacked structure, the first magnetic material has a plurality of through holes formed in a thickness direction and the second magnetic material filling the plurality of through holes.

* * * * *